(12) United States Patent
Bodensteiner et al.

(10) Patent No.: US 6,394,284 B2
(45) Date of Patent: *May 28, 2002

(54) METHOD AND SYSTEM FOR SECURING A PERSONAL COMPUTER TO A RACK

(75) Inventors: John R. Bodensteiner, Cedar Rapids, IA (US); Norman Boulard, Louisville, KY (US)

(73) Assignee: Crystal Group Inc., Hiawatha, IA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/883,037

(22) Filed: Jun. 15, 2001

Related U.S. Application Data

(63) Continuation of application No. 09/595,262, filed on Jun. 15, 2000, now Pat. No. 6,279,755.

(51) Int. Cl.⁷ .................................................. A47F 5/00
(52) U.S. Cl. ...................... 211/26; 211/189; 312/223.2; 361/683
(58) Field of Search .................. 211/26, 189; 361/683, 361/727, 726, 732; 312/223.2

(56) References Cited

U.S. PATENT DOCUMENTS

| 5,216,904 | A | 6/1993 | Isaki |
| 5,765,933 | A | 6/1998 | Paul et al. |
| 5,822,184 | A | 10/1998 | Rabinovitz |
| 6,123,203 | A | 9/2000 | Gibbons |
| 6,181,549 | B1 | 1/2001 | Mills et al. |
| 6,193,339 | B1 | 2/2001 | Behl et al. |
| 6,279,755 | B1 * | 8/2001 | Bodensteiner et al. ........ 211/26 |

* cited by examiner

Primary Examiner—Robert W. Gibson, Jr.
(74) Attorney, Agent, or Firm—Simmons, Perrine, Albright & Ellwood PLC

(57) ABSTRACT

A system and method for latching an industrial PC to a rack which uses a front end mounted handle which actuates a retractable hook member which engages a void in the shelf of a slot in the rack.

20 Claims, 6 Drawing Sheets

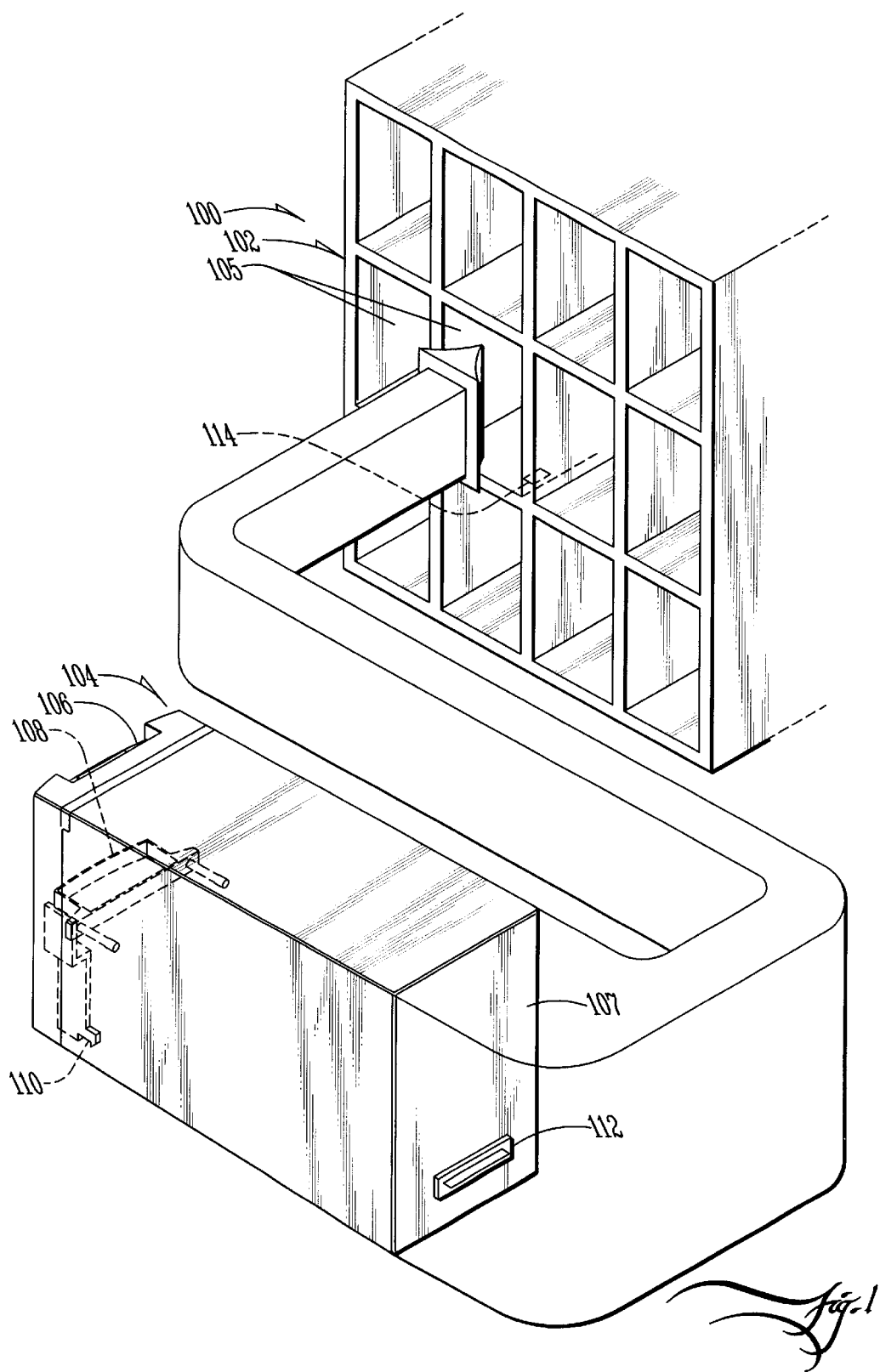

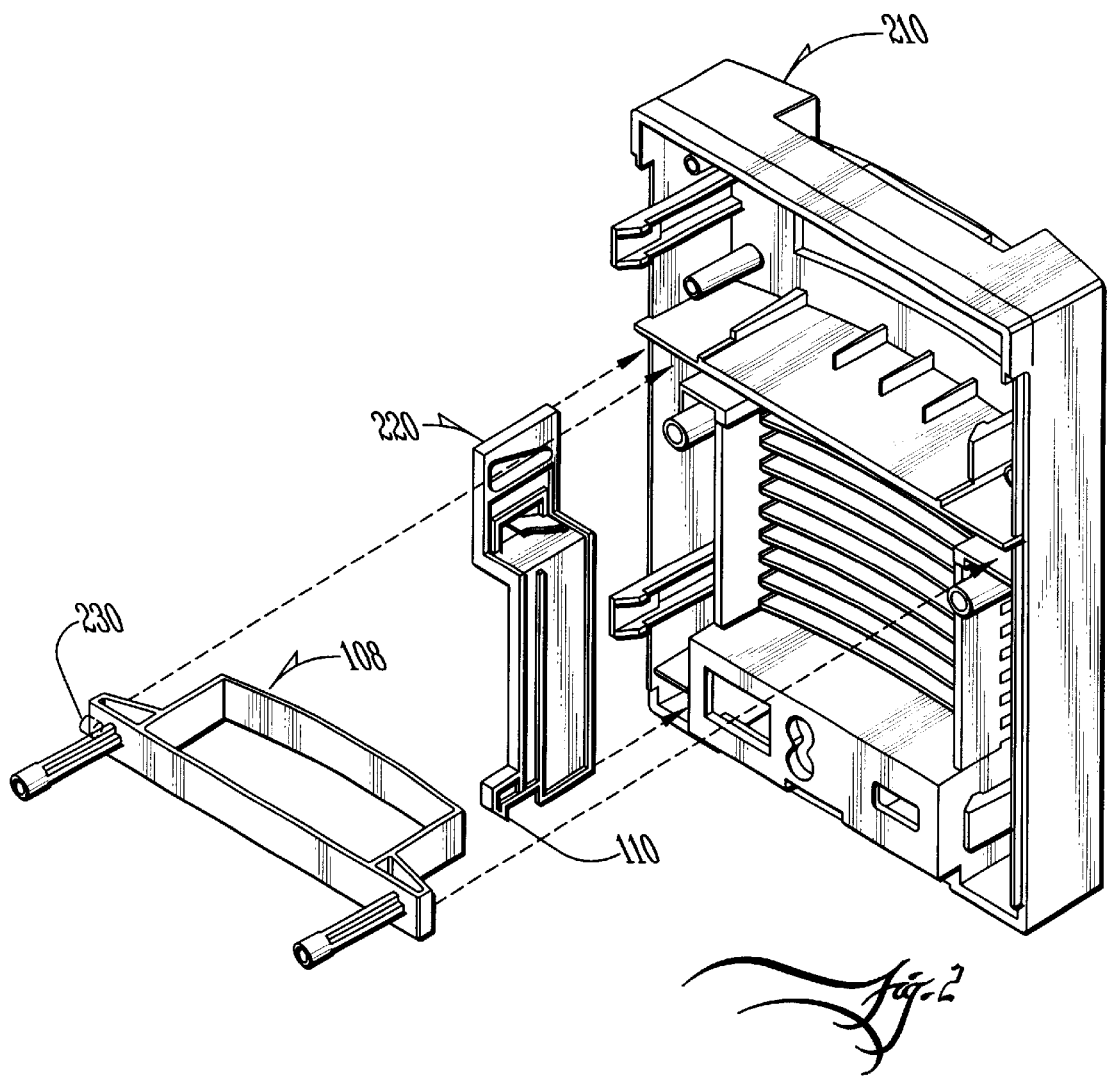

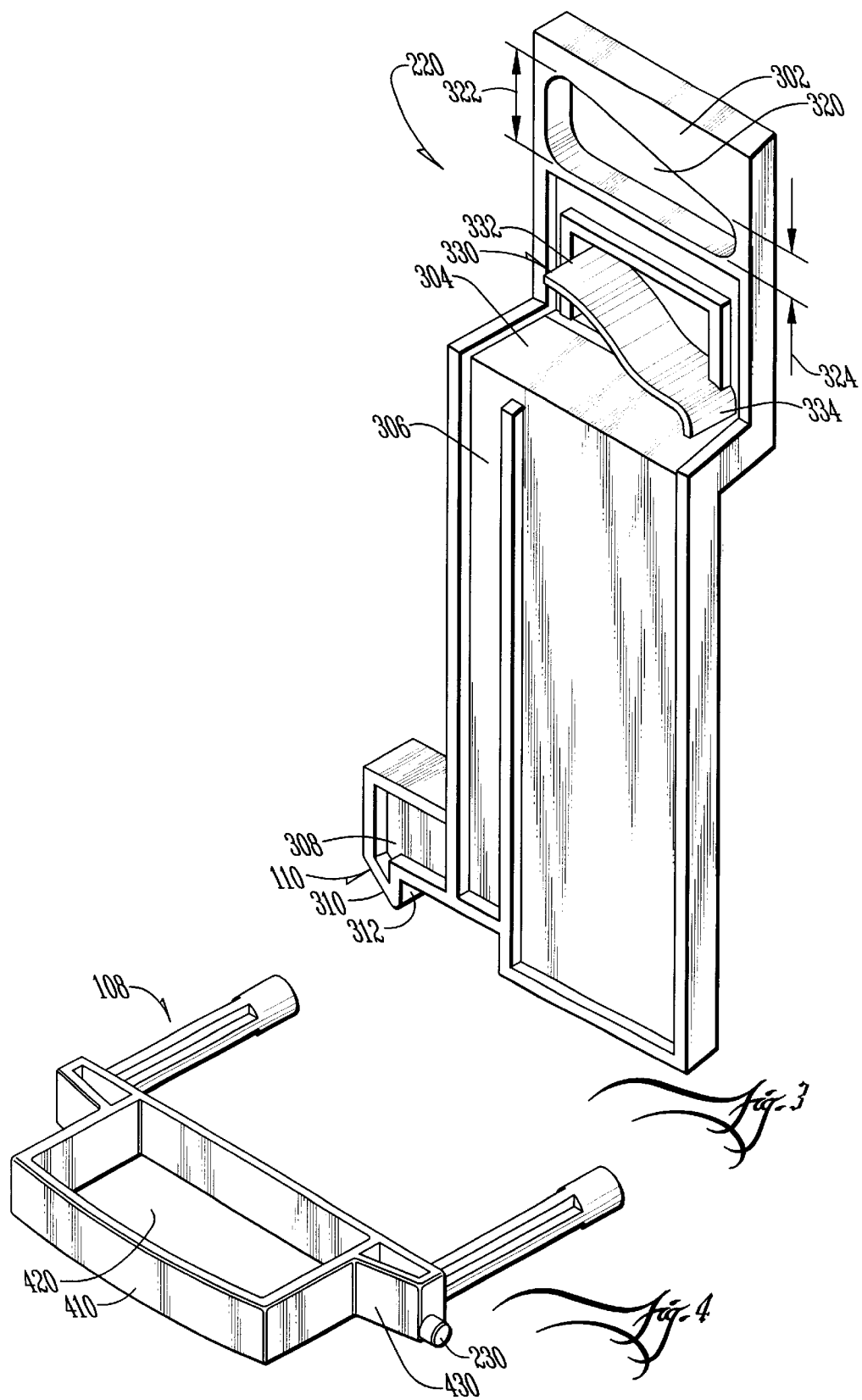

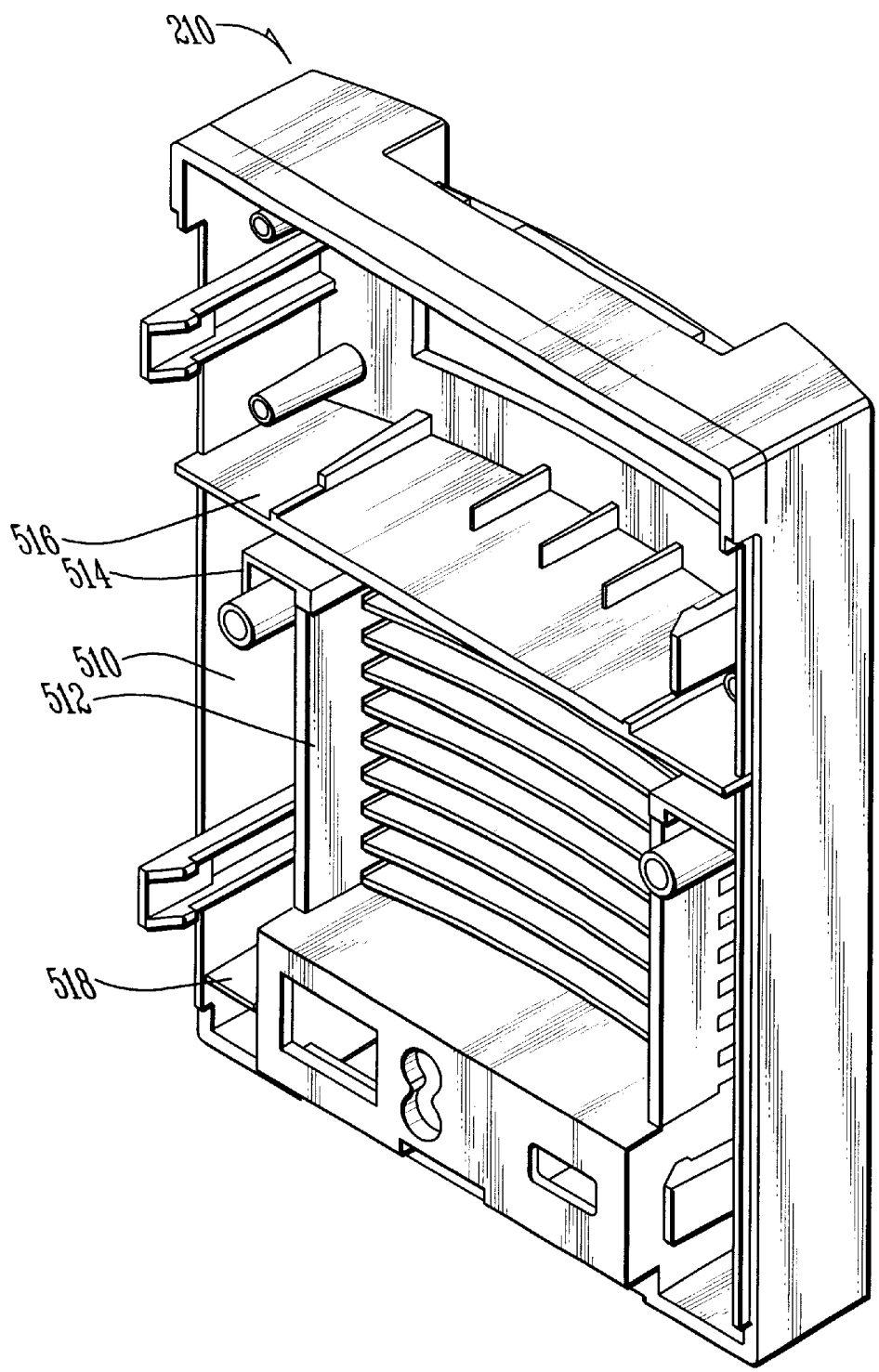

METHOD AND SYSTEM FOR SECURING A PERSONAL COMPUTER TO A RACK

This application is a continuation of U.S. application Ser. No. 09/595,262, filed Jun. 15, 2000, now U.S. Pat. No. 6,279,755.

FIELD OF THE INVENTION

The present invention generally relates to computers, and more particularly relates to personal computers, and even more particularly relates to methods and systems for securing personal computers into racks.

BACKGROUND OF THE INVENTION

In recent years, industrial personal computers have become increasingly prevalent in many industries. It is not uncommon today to see rows of industrial PCs arranged in racks. These racks of PCs are typically massive objects which remain generally stationary during normal operation. However, the racks and the computers within them may be subject to vibration, bumps, and other physical disturbances. It is generally desirable to have the PC securely mounted in the racks to prevent damage and/or cabling disconnections. A typical rack attachment approach is to use a faceplate on the PC which is slightly larger than the remaining exterior of the PC chassis. The faceplate is then screwed to a support structure located between the PCs in the rack. While many of these industrial PCs are often designed and manufactured to higher standards than consumer PCs, they still are occasionally in need of repair. When this happens, the PC is usually required to be removed from the rack.

While these enlarged faceplates, with mounting screws therethrough, have been used extensively in the past, they do have some drawbacks. First of all, it requires time, and it may require tools, to unscrew the mounting screws. Also, when these PCs are used outside of a rack, the oversized, faceplate can cause problems. For example, the PC will often be sitting at an angle on a desktop etc., and then only having very limited contact with the desktop. Otherwise, the use of a desk-mount adapter, which is essentially a sleeve into which the PC is inserted, is required. If a desk-mount adapter is not used, then the desktop may also be subject to undesirable wear along the areas of contact, and the PC may be unstable and susceptible to tipping or slipping off the desktop.

Consequently, there exists a need for improved methods and systems for securing a PC into a rack of PCs.

SUMMARY OF THE INVENTION

It is an object of the present invention to provide a system and method for securing a PC in a rack in an efficient manner.

It is a feature of the present invention to utilize a retractable base latch hook.

It is another feature of the present invention to include a front panel actuated latch handle.

It is an advantage of the present invention to achieve quick release of the PC from the PC rack.

It is another advantage of the present invention to reduce the need for desktop adapters.

It is another advantage of the present invention to provide an attractive faceplate.

The present invention is an apparatus and method securing industrial personal computers to a rack. The invention is designed to satisfy the aforementioned needs, provide the previously stated objects, include the above-listed features, and achieve the already articulated advantages. The present invention is carried out in a "mounting screw and enlarged faceplate-less" manner in a sense that the size of enlarged faceplates and the use of mounting screws have been greatly reduced.

Accordingly, the present invention is a system and method including an industrial computer, having a retractable rack hook, which is actuated by a front panel mounted handle.

BRIEF DESCRIPTION OF THE DRAWINGS

The invention may be more fully understood by reading the following description of the preferred embodiments of the invention, in conjunction with the appended drawings wherein:

FIG. 1 is an exploded perspective view of a system of the present invention.

FIG. 2 is an exploded perspective view of a partially dismantled faceplate portion of a PC of FIG. 1, including the retractable hook apparatus.

FIG. 3 is a perspective view of the retractable hook member of the present invention taken from a view point inside the PC looking outwardly.

FIG. 4 is a perspective view of the front panel mounted handle with a hook member engaging pin thereon.

FIG. 5 is a perspective view of a back side of a faceplate of the present invention.

DETAILED DESCRIPTION

Figure 6:
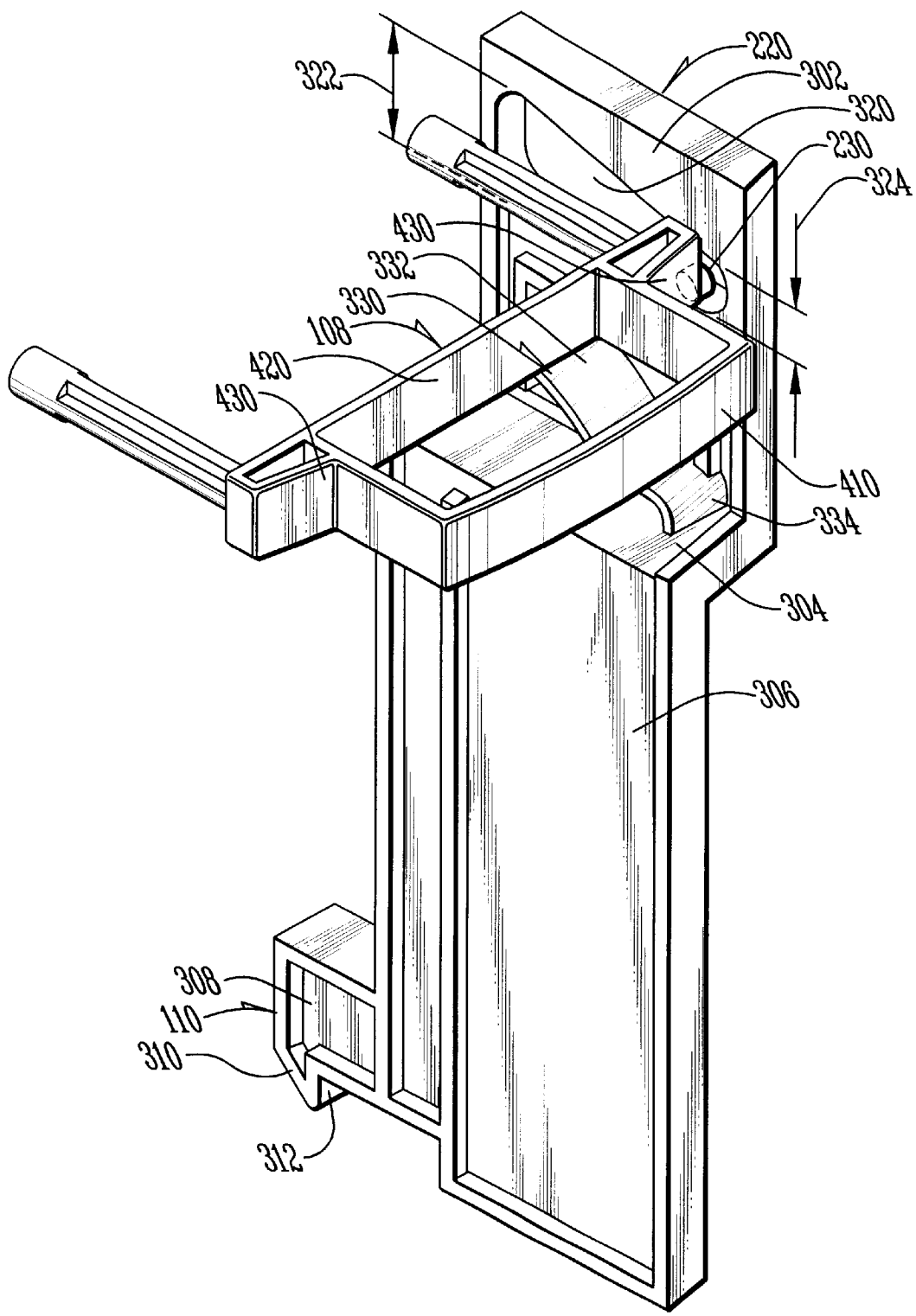
FIG. 6 is a perspective view of the cooperation between the pin receiving void of the hook member and the hook member engaging pin of the front panel mounted handle.

Now referring to the drawings wherein like numerals refer to like matter throughout, and more specifically referring to FIG. 1, there is shown a system of the present invention generally designated 100, including a rack 102 for retaining industrial PCs. An industrial PC 104 is shown having been removed from a slot 105 in rack 102. PC 104 has a front end 106 and a read end 107. Front end 106 has a handle 108 thereon. Also shown in FIG. 1 is a retractable hook member tip 110 and a quick connecting blind mating connector 112. Retractable hook member tip 110 will extend into hook receiving void 114 when PC 104 is placed within slot 105.

The PC 104 includes a faceplate 210 which is shown in FIG. 2 as having a retractable hook member 220 and handle 108, having a hook member engaging pin 230 thereon.

Now referring to FIG. 3, there is shown a retractable hook member 220 of FIG. 2, shown from an opposite direction from FIG. 2. Retractable hook member 220 is shown having a retractable hook member top section 302, a retractable hook member horizontal middle section 304, and retractable hook member bottom section 306, as well as a retractable hook member hook section 308. Retractable hook member hook section 308 includes an inclined leading hook member tip edge 310 and a hook member tip trailing edge 312. Also shown is a handle pin receiving void 320 with a handle pin receiving void maximum height dimension 322 and a handle pin receiving void minimum height dimension 324. The biasing of the retractable hook member 220 is accomplished by resilient member 330, which includes resilient member free floating end 332 and resilient member fixed end 334.

Now referring to FIG. 4, there is shown a more detailed drawing of the handle 108 of FIG. 1, which includes a handle faceplate surface 410, a finger receiving void 420, and a handle stop 430.

Now referring to FIG. 5, there is shown a faceplate 210 of FIG. 2, which includes a faceplate side wall 510, a hook member retaining wall 512, a resilient member vertical stop 514, a handle top guide shelf 516, and a hook member bottom alignment guide 518.

Now referring to FIG. 6, there is shown an alternate view of the cooperation between pin 230 and handle pin receiving void 320.

Figure 7:
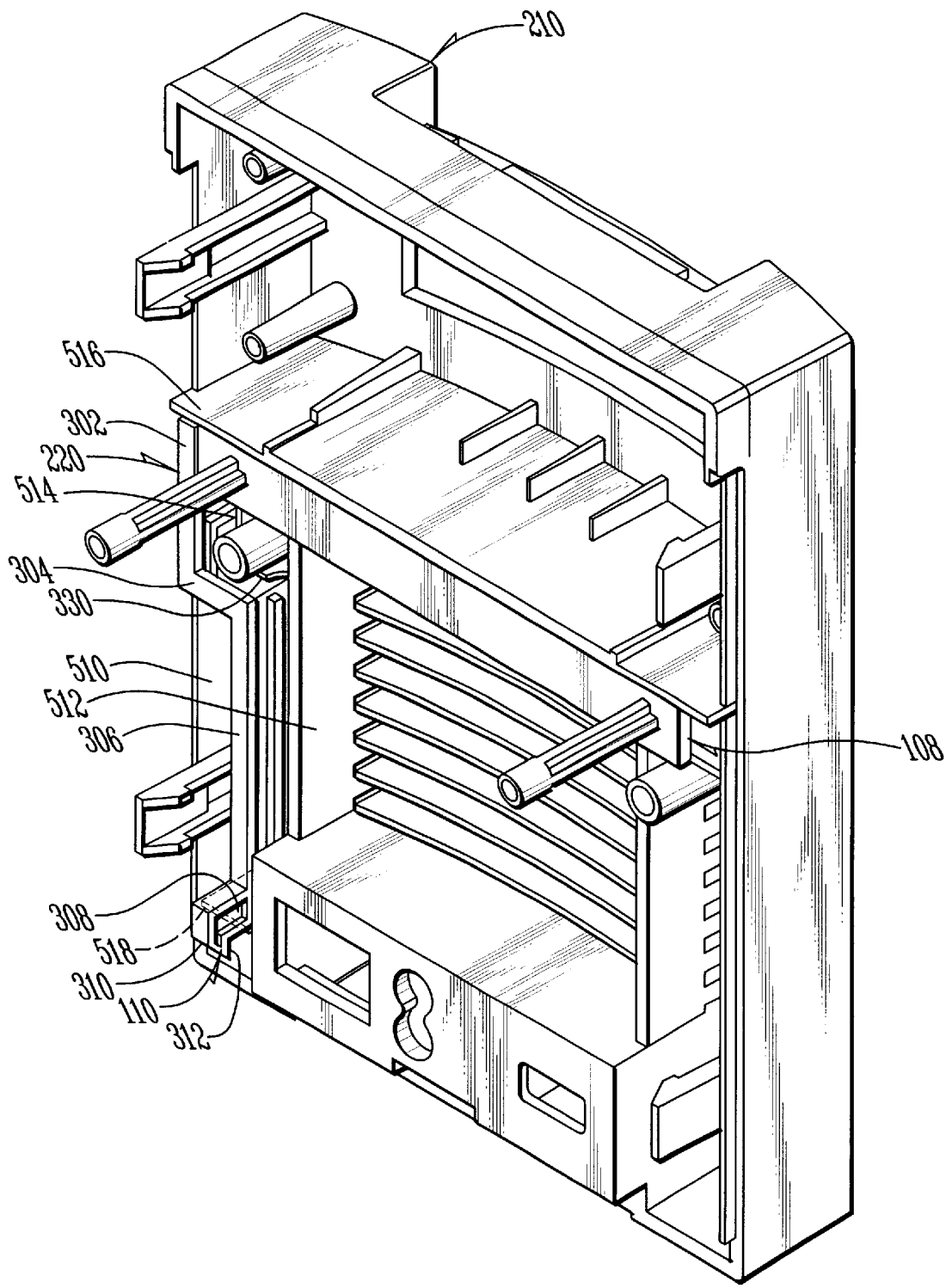
FIG. 7 is a perspective view of a completed assembly containing the hook member, the front panel mounted handle, and the faceplate, taken from a view point from behind the faceplate.

Now referring to FIG. 7, there is shown a view of the faceplate 210, retractable hook member 220, and handle 108 in an assembled configuration.

Throughout this description, reference is made to an industrial PC, because it is believed that the beneficial aspects of the present invention would be most readily apparent when used in connection with industrial PCs; however, it should be understood that the present invention is not intended to be limited to industrial PCs and should be hereby construed to include other non-industrial PCs.

Throughout this description, the handle is shown as a sliding handle which moves a sliding retractable member. It is believed that this may be preferred. However, the present invention is intended to include alternate styles of handles; for example, hinged and pivoting handles, as well as pivoting retractable hook members.

Throughout this description, the term "industrial PC" is used to represent a PC of the type which is capable of being stored in racks of multiple rows of PCs, where each row has multiple PCs and where the PCs are coupled to wiring associated with the rack and other equipment by at least one connector at the rear end of the PC. This definition of industrial PCs is not intended to include laptop PCs, which have connectors on the rear end of the laptop for coupling with a docking station or a port replicator. Consequently, the term "industrial PC" will specifically exclude any computer which has along its top side a hinged display screen hinged along the rear end of the PC.

It is thought that the method and apparatus of the present invention will be understood from the foregoing description and that it will be apparent that various changes may be made in the form, construct steps, and arrangement of the parts and steps thereof, without departing from the spirit and scope of the invention or sacrificing all of their material advantages. The form herein described is merely a preferred exemplary embodiment thereof.

We claim:

1. An industrial PC system comprising:
   a rack, having a plurality of slots therein for receiving a plurality of PCs;
   each slot having a means for engaging a retractable PC restraining member,
   a PC having a retractable PC restraining member which is actuated by a front panel mounted handle; and
   wherein said front panel mounted handle actuates said restraining member when a PC removing force is applied to any portion of said front panel mounted handle which causes said PC to tend to translate outwardly from one of said plurality of slots.

2. A system of claim 1 wherein said PC removing force is a force having a component thereof which is parallel with a longitudinal axis of said one of said plurality of slots.

3. A system of claim 2 wherein said retractable member is retracted inwardly toward the PC, when the front panel mounted handle is pulled with said PC remaining fore.

4. A system of claim 3 wherein the retractable PC restraining member is biased toward a non-retracted position outside of the PC.

5. A system of claim 4 wherein the front panel mounted handle remains stationary when an inwardly directed pressure is applied to the retractable PC restraining member.

6. A system of claim 5 wherein the inwardly directed pressure occurs when the PC is placed on a flat surface.

7. A system of claim 4 wherein the means for engaging the retractable PC restraining member is a member receiving void for receiving therein, a non-retracted retractable PC restraining member.

8. A system of claim 7 wherein the PC has a blind mating connector at it rear end for coupling with a rack mounted coupler.

9. A system of claim 8 wherein the front panel mounted handle has an elongated dimension in line with a longitudinal axis of the PC.

10. A system of claim 9 wherein the retractable PC restraining member has a pin receiving, void therein which mates with a pin protruding in a direction orthogonal to the longitudinal axis of the PC, from an interior portion of said front panel mounted handle.

11. A system of claim 10 wherein the pin receiving void has a non-uniform height dimension as a function of location along a longitudinal axis of the PC.

12. A system of claim 11 wherein said non-uniform height dimension is larger in a distal location with respect to the faceplate.

13. A system of claim 12 wherein a horizontal translational motion of said front panel mounted handle results in a vertical translational motion of said retractable PC restraining member.

14. A system of claim 13 wherein said retractable PC restraining member is shaped so as to cause retraction to occur when a portion of the retractable PC restraining member comes in contact with an obstruction while the PC is being slid into one of said plurality of slots.

15. A system of claim 14 wherein said retractable PC restraining member is shaped so as not to cause retraction to occur when a portion of the retractable PC restraining member comes in contact with an obstruction while the retractable PC restraining member is disposed in said member receiving void.

16. A method of manipulating a PC within a rack comprising the steps of:
   providing a PC with a retractable member,
   moving, in an inwardly direction, the PC into a slot in the rack;

inserting the PC into the slot, so that the retractable member becomes disposed within a void in the slot, thereby restricting translational motion of the PC with respect to the slot;

pulling a handle on the PC, in an outwardly direction, causing the handle to move with respect to the PC, so as to cause a retraction of the retractable member from the void in the slot;

further pulling the handle, in the outwardly direction, causing motion between the PC and the slot; and, removing the PC from the slot.

17. A method of claim 16 wherein the void in the slot is located in a horizontal shelf upon which the PC rests.

18. A method of claim 17 wherein the outwardly direction is parallel with a longitudinal axis of said PC.

19. A method of claim 18 wherein the step of pulling a handle on the PC, in an outwardly direction, causing the handle to move with respect to the PC, is initiated from a position with the handle being flush with a faceplate of the PC.

20. A method of manipulating a PC on a horizontal planar surface comprising the steps of:

providing a PC with a retractable member;

the PC further having feet attached to a rear portion of the PC, where a stroke characteristic of the retractable member exceeds a height characteristic of the feet;

setting the PC on the horizontal planar surface, so as to cause a retraction of the retractable member, while leaving fixed within the PC, a front panel mounted handle which is coupled through a mechanical linkage to the retractable member.

* * * * *